US009992899B2

(12) United States Patent
Sauer

(10) Patent No.: US 9,992,899 B2
(45) Date of Patent: Jun. 5, 2018

(54) SUPPORT MEMBER TO POSITION A SYSTEM BOARD

(71) Applicant: HEWLETT PACKARD ENTERPRISE DEVELOPMENT LP, Houston, TX (US)

(72) Inventor: Keith A Sauer, Spring, TX (US)

(73) Assignee: HEWLETT PACKARD ENTERPRISE DEVELOPMENT LP, Houston, TX (US)

(*) Notice: Subject to any disclaimer, the term of this patent is extended or adjusted under 35 U.S.C. 154(b) by 91 days.

(21) Appl. No.: 14/990,384

(22) Filed: Jan. 7, 2016

(65) Prior Publication Data
US 2016/0192528 A1 Jun. 30, 2016

Related U.S. Application Data

(63) Continuation of application No. 13/421,457, filed on Mar. 15, 2012, now Pat. No. 9,247,670.

(51) Int. Cl.
H05K 7/14 (2006.01)
H05K 7/20 (2006.01)

(52) U.S. Cl.
CPC ............ *H05K 7/1487* (2013.01); *H05K 7/20* (2013.01); *Y10T 29/49826* (2015.01)

(58) Field of Classification Search
CPC ...... H05K 7/20; H05K 7/1487; H05K 7/1422; Y10T 29/49826; G06F 1/183
USPC .......................................................... 211/26
See application file for complete search history.

(56) References Cited

U.S. PATENT DOCUMENTS

| 7,038,914 | B2 | 5/2006  | Heirich et al.   |
| 7,184,273 | B2 | 2/2007  | Sakai            |
| 7,298,607 | B2 | 11/2007 | Zielnicki        |
| 7,391,617 | B2 | 6/2008  | Veh              |
| 7,595,984 | B2 | 9/2009  | Ong et al.       |
| 7,606,044 | B2 | 10/2009 | Bailey et al.    |
| 7,613,005 | B2 | 11/2009 | Kuo et al.       |
| 7,656,657 | B2 | 2/2010  | Grady et al.     |
| 7,930,820 | B2 | 4/2011  | McAllister et al.|
| 8,045,343 | B2 | 10/2011 | Fan et al.       |

*Primary Examiner* — Ko H Chan
(74) *Attorney, Agent, or Firm* — Hewlett Packard Enterprise Patent Department

(57) ABSTRACT

A support member that positions a system board is provided herein. The support member includes a frame and a plurality of mounting members. The frame supports a system board. The plurality of mounting members are formed in the frame. The plurality of mounting members connect the frame to the system pan holding the system board. The plurality of mounting members are disposed on the frame to bend the system board.

18 Claims, 6 Drawing Sheets

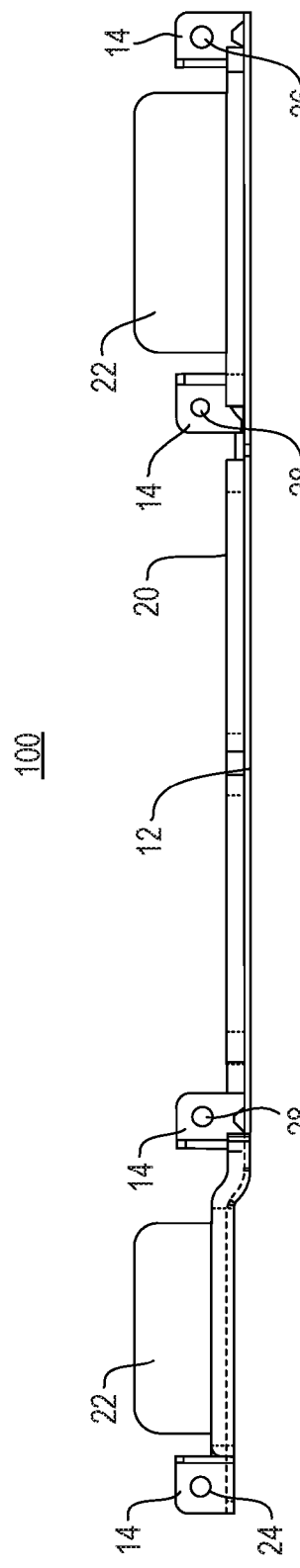
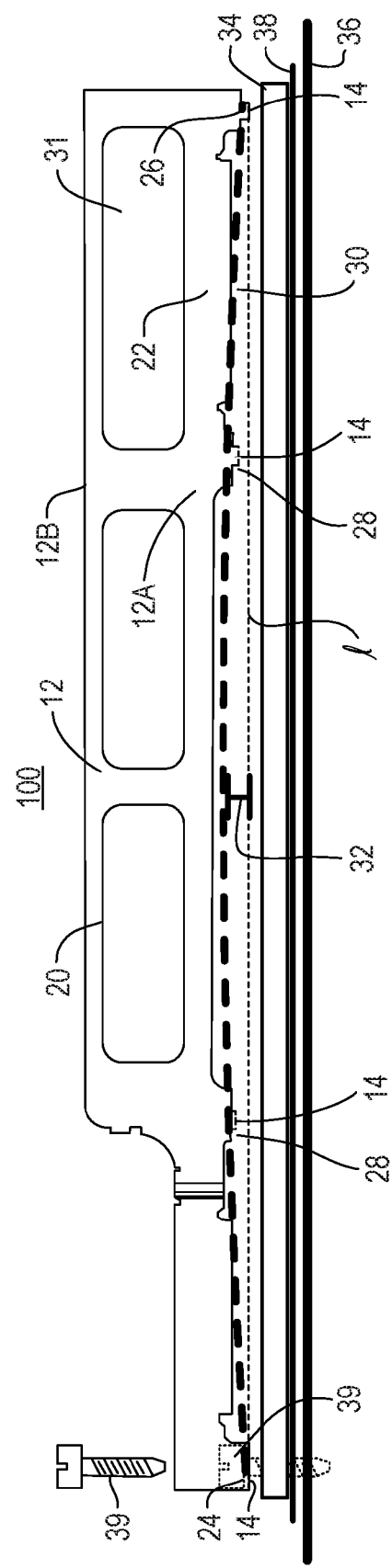

SUPPORT MEMBER TO POSITION A SYSTEM BOARD

CROSS-REFERENCE TO RELATED APPLICATION

This application is a continuation of co-pending U.S. patent application Ser. No. 13/421,457 entitled "SUPPORT MEMBER TO POSITION A SYSTEM BOARD," filed Mar. 15, 2012, which is hereby incorporated by reference in its entirety.

BACKGROUND

A server rack supports multiple servers. Server chassis on the server rack are used to support the servers on the server rack. A height limitation is provided for each server and server chassis to prevent contact between adjacent server chassis.

BRIEF DESCRIPTION OF THE DRAWINGS

Non-limiting examples of the present disclosure are described in the following description, read with reference to the figures attached hereto and do not limit the scope of the claims. In the figures, identical and similar structures, elements or parts thereof that appear in more than one figure are generally labeled with the same or similar references in the figures in which they appear. Dimensions of components and features illustrated in the figures are chosen primarily for convenience and clarity of presentation and are not necessarily to scale. Referring to the attached figures:

FIG. 2 illustrates a top view of the support member of FIG. 1 according to an example;

FIG. 3 illustrates a side view of the support member of FIG. 1 according to an example;

DETAILED DESCRIPTION

In the following detailed description, reference is made to the accompanying drawings which form a part hereof, and in which is depicted by way of illustration specific examples in which the present disclosure may be practiced. It is to be understood that other examples may be utilized and structural or logical changes may be made without departing from the scope of the present disclosure.

A server rack that supports multiple servers in a vertical direction has height limitations for the servers on a server chassis to prevent contact in the vertical direction between adjacent severs. As server technology advances the components of the servers become more compact and powerful allowing for an increase in the density of the components attached to the system board of the server. As the system board becomes heavier the server and server chassis sag in the middle of the server chassis. The sag increases as the weight of the server increases resulting in the sag exceeding the height limitation and coming into contact with the server that is vertically positioned below. One way to reduce the sag is to pre-bow the sheet metal that forms the chassis; however, as the weight of the components increase, pre-bowing the sheet metal alone does not reduce the vertical movement of the server chassis that causes the sag.

In examples, a support member to position a system board is provided. The support member includes a frame and a plurality of mounting members. The frame supports a system board. The plurality of mounting members are formed in the frame to connect the frame to the system board. The plurality of mounting members are disposed on the frame to bend the system board.

Figure 1:
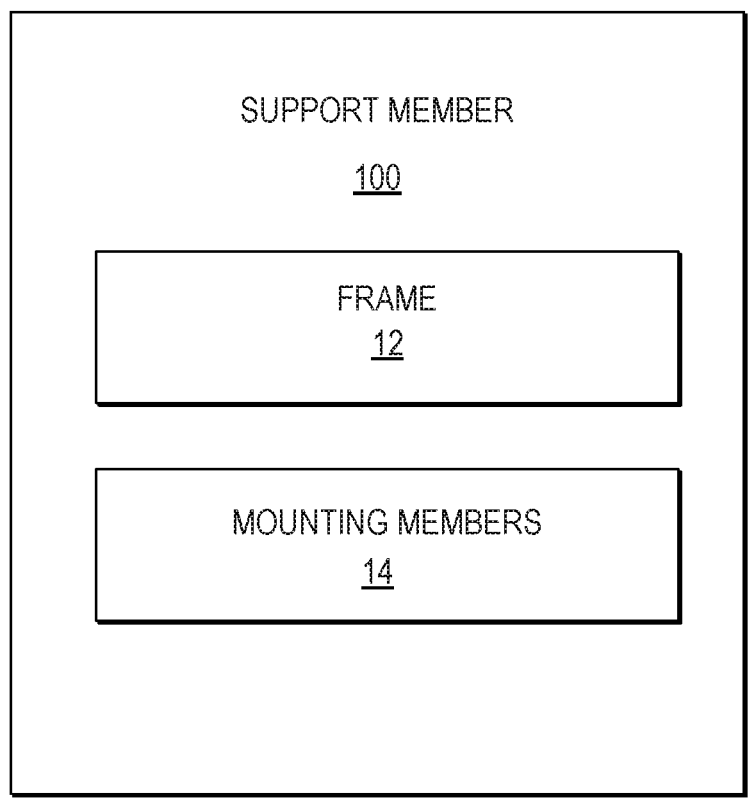
FIG. 1 illustrates a block diagram of a support member according to an example.

FIG. 1 illustrates a block diagram of a support member 100 to position a system board, according to an example. The support member 100 includes a frame 12 and a plurality of mounting members 14. The frame 12 is a weight bearing member that supports the system board and/or the system pan. The frame 12 is made of a steel or a steel composition, such as steel, galvanized, cold rolled coil (SGCC) that is, for example, cold rolled steel about one and a half millimeters thick. The frame 12 connects to the system board and/or system pan via the plurality of mounting members 14.

The plurality of mounting members 14 are formed in the frame 12 and connect the frame 12 to the system pan holding the system board. The plurality of mounting members 14 are disposed on the frame 12 to bend the system board. For example, the plurality of mounting members form an arc such that the system board and/or system pan bends or bows to substantially conform to the arc. The server is on a server rack that holds multiple servers vertically therein. For example, when the mounting members 14 are connected to the system pan, the mounting members 14 bow the system board and the system pan in an upward direction relative to or away from the server positioned therebelow to substantially conform to the arc.

FIGS. 2-3 further illustrate the support member 100 of FIG. 1 according to examples. FIG. 2 illustrates a top view of the support member 100, and FIG. 3 illustrates a side view of the support member 100. As illustrated in FIGS. 2-3, the support member 100 includes a frame 12, a plurality of mounting members 14, and a handle member 20 formed therein. The support member 100 also includes a heat sink bracket 22 extending from the frame 12 to receive and/or support a heat sink.

The frame 12 includes a bottom portion 12A and a top portion 12B. The bottom portion 12A of the frame 12 is connectable to a system board 34 and a system pan 36 to support the weight of the system board 34 components and reduce sagging in the middle of the system board 34. The bottom portion 12A may also include the heat sink bracket 22. The top portion 12B includes the handle member 20 and may further connect to a pivoting member that connects the frame 12 to a heat sink cage as illustrated below in FIGS. 4-5.

Referring to FIGS. 2-3, the plurality of mounting members 14 are positioned on the bottom portion 12A of the frame 12. The plurality of mounting members 14 are illustrated as four mounting members 14, a first mounting member 24 at one end of the frame 12, a second mounting member 26 at an opposite end of the frame 12, and at least one offset mounting member 28 therebetween, illustrated as two offset mounting members 28. As illustrated in FIG. 3, the at least one offset mounting member 28 is offset from the first and the second mounting members 24, 26 to form an arc 30 that when attached to the system board 34 bend or bow the system board 34 in, for example, an upward direction relative to adjacent system boards or servers on a server rack. The offset mounting members 28 may be spaced apart from the first and second mounting members 24, 26, such that, the offset mounting members 28 are positioned about one millimeter or one and a half millimeters higher 32 than the first and the second mounting members 24, 26 to bow the system board 34 in the upward direction relative to the sever positioned therebelow on the server rack. For example, the line l between the first and second mounting members 24, 26 and the arc 30 illustrates an example of the bend or bow in an upward direction that the system board 34 conforms to.

Referring to FIGS. 2-3, the handle member 20 is formed as an aperture in the frame 12, and is illustrated as formed from two apertures; however, depending on the frame 12, the handle member 20 may be formed of at least one aperture and/or include an additional member added to the frame 12. The handle member 20 enables easy insertion and removal of the support member 100 with the system board 34 and the system pan 36 attached. When the handle member 20 is formed from aperture(s) the weight of the frame 12 is reduced, while keeping the structural support of the frame 12. Furthermore, additional apertures 31 may be provided to reduce material and reduce the weight of the support member 100.

As illustrated in FIG. 3, a fastener 39 may be used to secure the frame 12 to the system pan 36. The fastener 39 is inserted into each of the plurality of mounting members 14 through the system board 34 and a system sub-pan 38 and into the system pan 36. The fastener 39 is illustrated as, for example, a screw; however other fasteners may be used.

Figure 4:
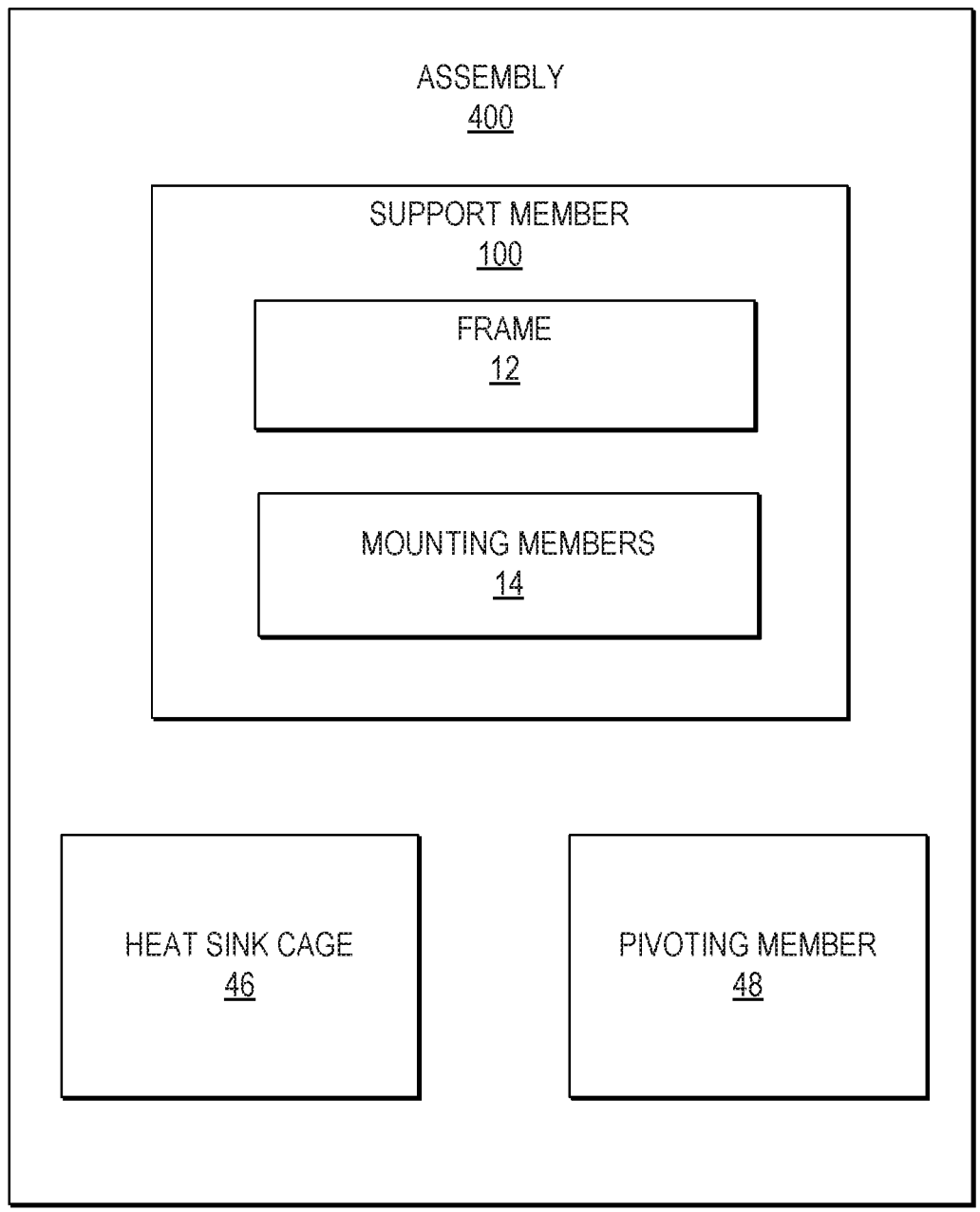
FIG. 4 illustrates block diagram of an assembly according to an example.

FIG. 4 illustrates a block diagram of an assembly 400 according to an example. The assembly 400 supports a system board 34 and a heat sink, illustrated as 62 in FIG. 6. The assembly 400 includes a support member 100, a heat sink cage 46, and a pivoting member 48. The support member 100 positions a system board 34 and includes a frame 12 and a plurality of mounting members 14. The frame 12 supports the system board 34. The frame 12 also connects to the system board 34 and a system pan 36 using the plurality of mounting members 14.

The plurality of mounting members 14 are formed in the frame 12 to connect the frame 12 to the system pan 36 that holds the system board 34. The plurality of mounting members 14 are disposed at varying positions along the frame 12 to bend the system board 34. For example, the plurality of mounting members 14 form an arc 30 that when mounted to the system board 34 causes the system board 34 to bend and conform to the arc 30. In a server rack with multiple servers vertically positioned therein, the plurality of mounting members 14 bow or bend the system board 34 and/or the system pan 36 to conform to the arc 30, such that the arc 30 is in an upward direction relative to the server therebelow and/or away from an adjacent server. The heat sink cage 46 extends from the frame 12 to support a heat sink. The pivoting member 48 connects the frame and the heat sink cage 46 and enables rotation therebetween. For example, the pivoting member 48 engages with the frame 12 and the heat sink cage 46 to pivotally or rotationally connect the heat sink cage 46 to the frame 12.

Figure 5:
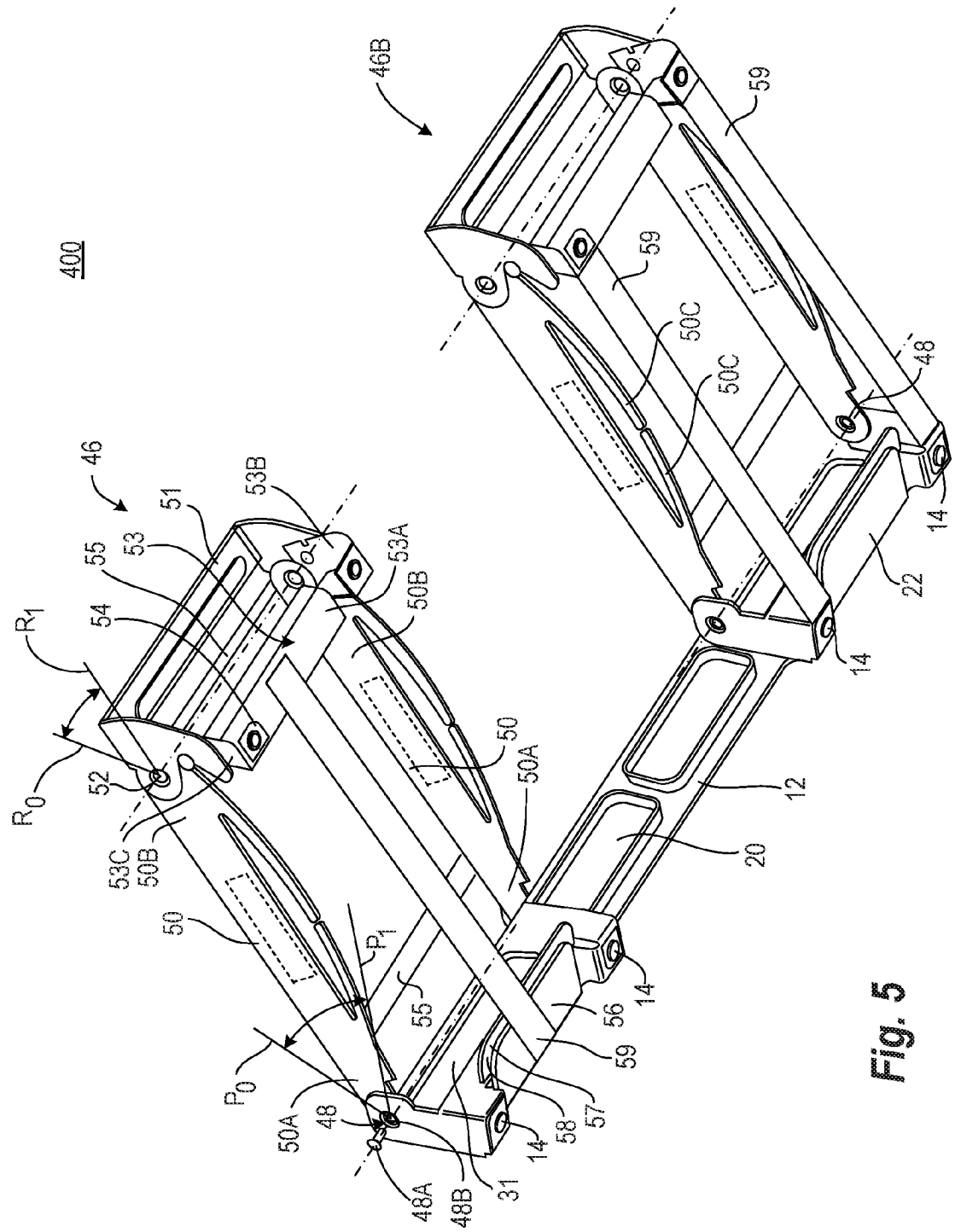
FIG. 5 illustrates a schematic diagram of the assembly of FIG. 4 according to an example.

FIG. 5 illustrates a schematic diagram of the assembly of FIG. 4 according to an example. The assembly 400 includes a frame 12 with two heat sink cages 46, illustrated as heat sink cages 46A and 46B. The heat sink cages are attached to the frame 12 using pivoting members 48 that allow the heat sink cages 46 to rotate or pivot about the pivoting members 48. For example, the pivoting member 48 includes a rivet 48A inserted through a pivot aperture 48B of the frame 12.

The pivoting members 48 are illustrated as including two pivoting members 48 for each heat sink cage 46. For example, the pivoting members 48 are illustrated as being located on the top portion 12B of the frame 12 opposite the plurality of mounting members 14. As illustrated, the top portion 12B of the frame 12 attaches to the heat sink cage 46, and the plurality of mounting members 14 attach the bottom portion 12A of the frame 12 to the system board 34.

As illustrated above in FIG. 3, the plurality of mounting members 14 include a first mounting member 24 at one end of the frame 12, a second mounting member 26 at an opposite end of the frame 12, and at least one offset mounting member 28 therebetween. The offset mounting member 28 is illustrated as two mounting members 14, each offset from the first and the second mounting member 24, 26 to form an arc 30 therebetween. The plurality of mounting members 14 bow or bend the system board 34 to conform to the arc 30, such as, bending the system board in the upward direction. The arc 30 formed by the plurality of mounting members 14 hold the system board 34 to reduce sagging and/or over sagging that causes the system pan 36 to contact the system board 34 positioned below on a rack of servers with multiple servers vertically positioned therein.

The heat sink cage 46 includes a pair of brace structures 50 extending from the frame 12 to position a heat sink on the system board 34. The pair of brace structures 50 include a frame end 50A and a clamp end 50B. The pair of brace structures 50 further include a brace support member 55 between the pair of brace structures 50 to hold the pair of brace structures 50 in place. FIG. 5 includes two brace support members 55, one at the frame end 50A and one at the clamp end 50B. Each of the brace structures 50 may further include at least one tab 50C to hold the heat sink in place.

The frame end 50A of each brace structure 50 is connected to the frame 12 via the pivoting member 48, which may include the rivet 48A and a pivot aperture 48B to keep the frame 12 and brace structures 50 connected and enable rotation of the brace structures 50 around the pivot member 48. The brace structures 50 pivot or rotate around the pivot member 48 such that the brace structures 50 move the heat sink cage 46 between a first position $P_0$ and a second position $P_1$ to insert and/or remove the heat sink therefrom. For example, in the first position $P_0$, the brace structures 50 are rotated to an open position that enables insertion and connection of the heat sink to the system board 34. In the second position $P_1$, the brace structures 50 are rotated to a closed position that enables the heat sink to be secured in the heat sink cage using a heat sink clamp 51.

The clamp end 50B of each brace structure 50 is connected to a heat sink clamp 51. The heat sink clamp 51 extends between the pair of brace structures 50 to hold the heat sink adjacent to the system board 34. The heat sink clamp 51 is connected to the brace structures 50 at the clamp end 50B using a spool 52 that engages with the heat sink clamp 51 to rotate the heat sink clamp 51 between a first or closed position $R_1$ and second or open position $R_0$. In the first position $R_1$, the heat sink clamp 51 compresses the heat sink adjacent to the system board 34. In the second position $R_0$, the heat sink clamp 51 releases the pressure to the heat sink that holds the heat sink in place, which enables the heat sink cage 46 to be moved to a second or open position. The heat sink clamp 51 is a mechanical locking mechanism that holds the heat sink in place.

The heat sink cage 46 is mountable to the system board 34. For example, the heat sink cage 46 includes a heat sink connector member 53 to connect the heat sink cage 46 to the system board 34. The heat sink connector member 53 may further include at least one cage mounting member 54 to connect to the system board 34 via a fastener, similar to the fastener 39 described in FIG. 3. Moreover, the heat sink connector member 53 may be formed of multiple portions. Referring to FIG. 5, the heat sink connector member 53 includes a base portion 53A to connect to the system board 34 and two side portions 53B, 53C that connect to the clamp end 50B of the brace structures 50.

The assembly further includes a heat sink bracket 22 for each heat sink cage 46. The heat sink bracket 22 may be separate from the heat sink cage 46 as illustrated in FIGS. 2-3 or connected to the heat sink cage 46 as illustrated in FIG. 5. In both examples, the heat sink bracket 22 extends from the frame 12 and includes a first heat sink support 56 and a second heat sink support 57. The first heat sink support 56 and the second heat sink support 57 are formed to receive a portion of the heat sink therebetween 58.

The assembly of FIG. 5 further includes a heat sink support extender 59 that extends over a portion of the perimeter of the heat sink cage 46. The heat sink support extender 59 extends between the frame 12 and the heat sink cage 46. For example, the heat sink support extender 59 is between the heat sink bracket 22 and the heat sink connector member 53 to provide additional support of the heat sink. The heat sink extender 59 may be a single support structure as illustrated in heat sink cage 46A or a plurality of support structures, as illustrated in heat sink 46B. Use of the heat sink extender 59, enables the heat sink connector member 53 to be connected to the assembly 400. The heat sink extender 59 assists with ease of assembly and attachment to the system board as well as prevents misalignment of the heat sink on the system board 34.

The frame 12 also includes a handle member 20 formed of a pair of apertures to enable insertion and removal of the support member with the system board 34. The handle member 20 may be added to the frame 12 and/or formed from apertures in the frame to reduce the weight of the frame. The frame 12 is made of a steel composition, such as SGCC that is, for example, cold rolled steel about one and a half millimeters thick.

Figure 6:
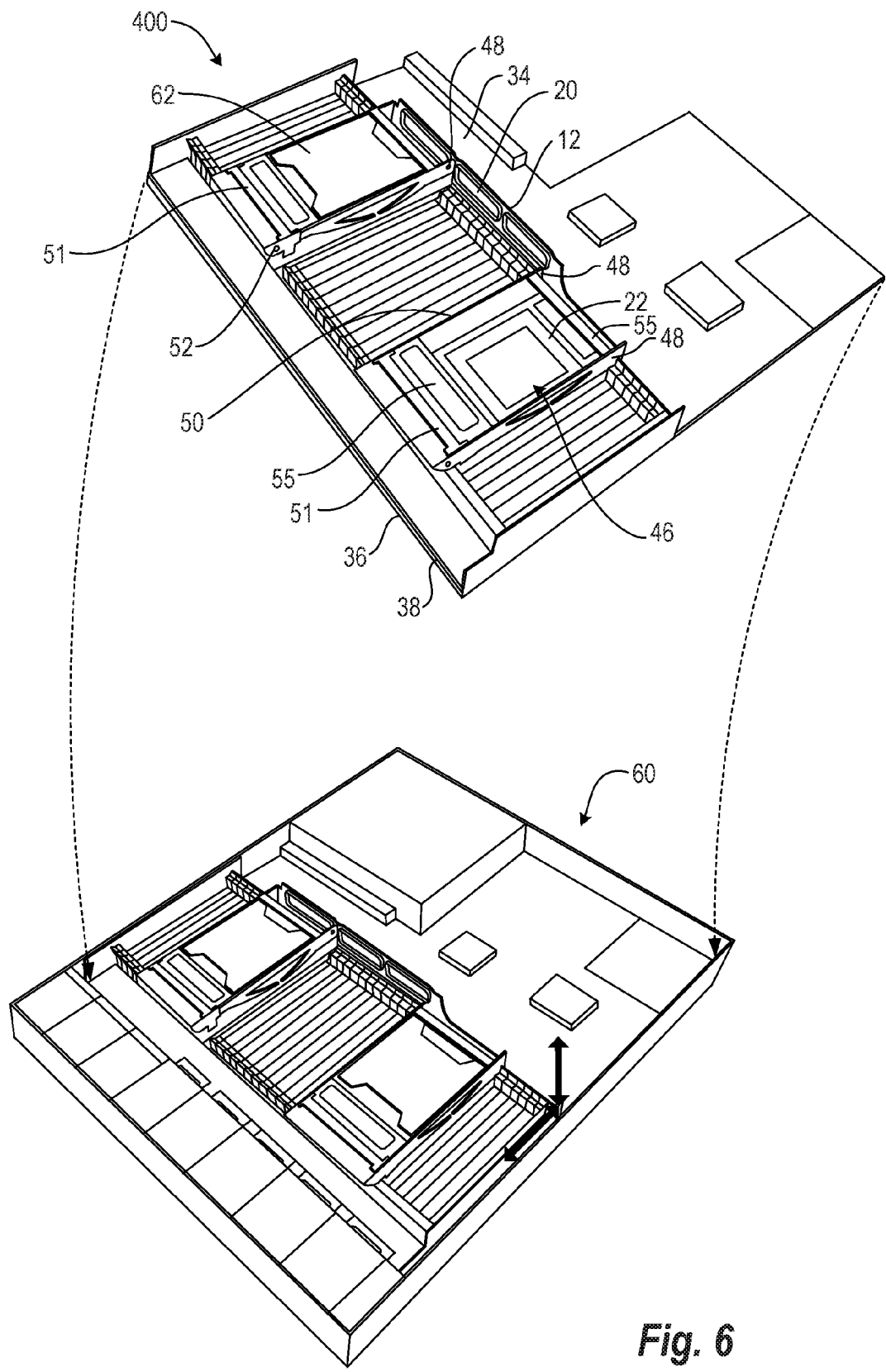
FIG. 6 illustrates a schematic diagram of the assembly of FIG. 4 inserted into a server chassis according to an example.

FIG. 6 illustrates a schematic diagram of the assembly 400 of FIG. 4 inserted into a server chassis 60 according to an example. In preparation for insertion, the assembly 400 is attached to a system board 34, a system sub-pan 38, and a system pan 36 and a heat sink 62 is attached to the system board 34 using the heat sink cage 46. Referring to FIG. 6, the handle member 20 may be used to insert and remove the assembly 400 from a server chassis 60. For example, a handle member 20 may be used to place the assembly 400 attached to the system pan 36 in the server chassis 60 and slide the system pan 36 into position on the server chassis 60.

Figure 7:
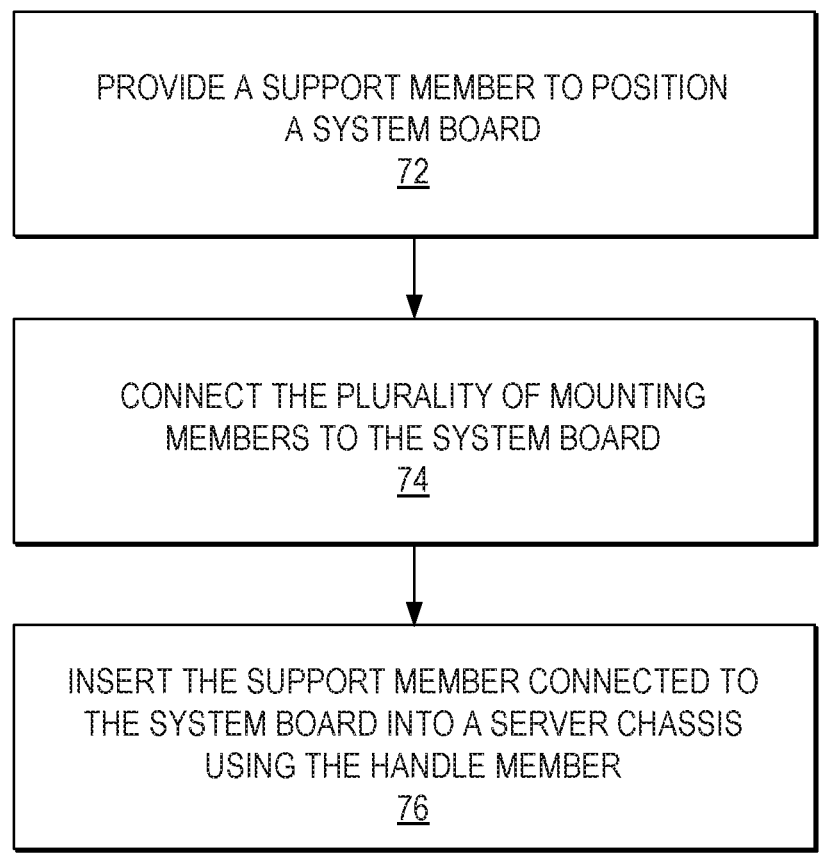
FIG. 7 illustrates a flow chart of a method to position a system board according to an example.

FIG. 7 illustrates a flow chart 700 of a method to position a system board according to an example. In block 72, a support member is provided to position a system board. The support member also reduces movement of a system pan in a downward direction. For example, the support member reduces sagging in the middle of a system pan positioned on a server rack having multiple servers vertically positioned on the server rack. The support member includes a frame and a plurality of mounting members. The frame supports a system board. The frame connects to a system board and system pan using the plurality of mounting members.

The plurality of mounting members are formed in the frame to connect the frame to the system pan holding the system board such that the plurality of mounting members bend the system board. For example, the plurality of mounting members are positioned to form an arc that, when attached to the system board, bows or bends the system board to substantially conform to the arc. For example, the plurality of mounting members bend the system board in an upward direction relative to other servers vertically positioned therebelow on a server rack. The frame also includes a handle formed therein. The handle may be used to position the frame with the system board and the system pan attached on the server chassis.

The plurality of mounting members are connected to the system board, in block 74. The plurality of mounting members bend the system board in an upward direction to form an arc between the plurality of mounting members. In block 76, the support member connected to the system board is inserted into a server chassis using the handle member. For example, the handle member may be used to lift the frame with the system board and system pan attached and place the system board into a server chassis. The system pan holding the system board is placed into the server chassis using the handle member. The handle member may be used to slide the system pan into a secure position on the server chassis. Similarly, the system board and system pan are removed from the server chassis using the handle member. For example, the handle member may be used to slide the system pan out of the secure position and remove the system pan and system board therefrom. The method may also include a heat sink cage being connected to the support member, such that the support member and the heat sink cage support the heat sink on the system board. For example, the heat sink may be connected to the system board and held into place with the support member and heat sink cage prior to the placement of the system board into the server chassis.

The present disclosure has been described using non-limiting detailed descriptions of examples thereof and is not intended to limit the scope of the present disclosure. It should be understood that features and/or operations described with respect to one example may be used with other examples and that not all examples of the present disclosure have all of the features and/or operations illustrated in a particular figure or described with respect to one of the examples. Variations of examples described will occur to persons of the art. Furthermore, the terms "comprise," "include," "have" and their conjugates, shall mean, when used in the present disclosure and/or claims, "including but not necessarily limited to."

It is noted that some of the above described examples may include structure, acts or details of structures and acts that may not be essential to the present disclosure and are intended to be exemplary. Structure and acts described herein are replaceable by equivalents, which perform the same function, even if the structure or acts are different, as known in the art. Therefore, the scope of the present disclosure is limited only by the elements and limitations as used in the claims.

What is claimed is:

1. A support member to position a system board, the support member comprising:
    a frame to support the system board;
    a plurality of mounting members formed in the frame to connect the frame to the system board, the plurality of mounting members disposed on the frame to bend the system board; and
    a pivoting member to rotationally connect the frame to a heat sink cage, wherein the heat sink cage comprises a pair of brace structures extending from the frame to position a heat sink on the system board, the pair of brace structures connected to the frame via the pivoting member; and a heat sink clamp attached to the pair of brace structures to hold the heat sink adjacent to the system board.

2. The support member of claim 1, further comprising a heat sink bracket extending from the frame to receive the heat sink.

3. The support member of claim 1, wherein the plurality of mounting members include a first mounting member at one end of the frame, a second mounting member at an opposite end of the frame, and at least one offset mounting member therebetween, the at least one offset mounting member offset from the first and the second mounting member to form an arc such that the system board bends to substantially conform to the arc.

4. An assembly useable with a system board, the assembly comprising:
   a support member to position the system board, the support member including:
      a frame to support the system board, and
      a plurality of mounting members formed in the frame to connect the frame to the system board, the plurality of mounting members disposed at varying positions along the frame to bend the system board;
   a heat sink cage extending from the frame to receive a heat sink; and
   a heat sink bracket extending from the frame to support the heat sink; and
   a pivoting member to connect the frame and the heat sink cage and enable rotation therebetween,
   wherein the heat sink cage comprises a pair of brace structures extending from the frame to position the heat sink on the system board, the pair of brace structures connected to the frame via the pivoting member; and a heat sink clamp attached to the pair of brace structures to hold the heat sink adjacent to the system board.

5. The assembly of claim 4, wherein the pivoting member including a pivot aperture and a rivet.

6. The assembly of claim 5, wherein the heat sink cage further comprises a spool that engages with the heat sink clamp to rotate the heat sink clamp between an open position and a closed position, wherein in the closed position the heat sink clamp compresses the heat sink adjacent to the system board.

7. The assembly of claim 5, further comprising a brace support member positioned between the pair of brace structures to hold the pair of brace structures in place.

8. The assembly of claim 4, wherein the heat sink cage further comprises a heat sink connector member to connect the heat sink cage to the system board.

9. The assembly of claim 8, wherein the heat sink cage further comprises a heat sink support extender extending from the frame to the heat sink connector member to support the heat sink.

10. The assembly of claim 4, wherein the heat sink bracket includes a first heat sink support and a second heat sink support, the first heat sink support and the second heat sink support are formed to receive a portion of the heat sink therebetween.

11. The assembly of claim 4, wherein the frame further comprises a handle member formed therein to enable insertion and removal of the support member with the system board attached.

12. The assembly of claim 4, wherein the plurality of mounting members include a first mounting member at one end of the frame, a second mounting member at an opposite end of the frame, and at least one offset mounting member therebetween, the offset mounting member offset from the first mounting member and the second mounting member to form an arc such that the system board bends to substantially conform to the arc.

13. A support member to position a system board, the support member comprising:
   a frame to support the system board; and
   a plurality of mounting members formed in the frame to connect the frame to the system board, the plurality of mounting members disposed on the frame to bend the system board using at least one offset mounting member, the at least one offset mounting member offset from the plurality of mounting members to form an arc such that the system board bends to substantially conform to the arc, and
   a pivoting member to rotationally connect the frame to a heat sink cage,
   wherein the heat sink cage comprises a pair of brace structures extending from the frame to position a heat sink on the system board, the pair of brace structures connected to the frame via the pivoting member; and a heat sink clamp attached to the pair of brace structures to hold the heat sink adjacent to the system board.

14. The support member of claim 13, further comprising a heat sink bracket extending from the frame to receive a heat sink.

15. The support member of claim 13, wherein the frame further comprises a handle member formed therein to enable insertion and removal of the support member with the system board attached.

16. The support member of claim 13, wherein the plurality of mounting members include a first mounting member at one end of the frame and a second mounting member at an opposite end of the frame, and the at least one offset mounting member positioned therebetween.

17. The support member of claim 16, wherein the at least one offset mounting member is positioned about one millimeter higher than the first mounting member and the second mounting member to bend the system board.

18. The support member of claim 16, wherein the at least one offset mounting member is positioned about one and a half millimeters higher than the first mounting member and the second mounting member to bend the system board.

* * * * *